US006710588B1

(12) United States Patent
Verfuerth et al.

(10) Patent No.: US 6,710,588 B1
(45) Date of Patent: Mar. 23, 2004

(54) APPARATUS AND METHOD FOR COMPARISON OF ELECTRIC POWER EFFICIENCY OF LIGHTING SOURCES TO IN EFFECT BE A VIRTUAL POWER PLANT

(76) Inventors: Neal R. Verfuerth, 642 Western Ave., Random Lake, WI (US) 53075; Michael J. Potts, N7203 County Rd. J., Plymouth, WI (US) 53073

( * ) Notice: Subject to any disclaimer, the term of this patent is extended or adjusted under 35 U.S.C. 154(b) by 17 days.

(21) Appl. No.: 10/166,541

(22) Filed: Jun. 11, 2002

(51) Int. Cl.[7] .................................................. G01R 7/00
(52) U.S. Cl. ....................................................... 324/142
(58) Field of Search ............................ 324/103 R, 114, 324/142, 158.1; 700/286, 291, 293; 702/60, 62

(56) References Cited

U.S. PATENT DOCUMENTS

| | | | | |
|---|---|---|---|---|
| 4,701,698 A | 10/1987 | Karlsson | ..................... | 324/116 |
| 4,933,633 A | 6/1990 | Allgood | ..................... | 324/142 |
| 5,315,236 A | 5/1994 | Lee | ..................... | 324/157 |

*Primary Examiner*—David A. Zarneke
*Assistant Examiner*—Minh N. Tang
(74) *Attorney, Agent, or Firm*—Robert T. Johnson

(57) ABSTRACT

To reduce the electric power demand in lighting the inside of buildings, apparatus and method for determining the most efficient lighting method, when comparing for example incandescent lighting with fluorescent lighting based on electric power demand for most efficient lighting, is disclosed.

4 Claims, 3 Drawing Sheets

APPARATUS AND METHOD FOR COMPARISON OF ELECTRIC POWER EFFICIENCY OF LIGHTING SOURCES TO IN EFFECT BE A VIRTUAL POWER PLANT

BACKGROUND OF THE INVENTION

Electric power requirements in a lighting system can be reduced by monitoring to attain highest efficiency of lighting for reduced power demand, which reduction is reflected in reduced transmission and power generation. demand.

SUMMARY OF INVENTION

Disclosure is made of apparatus and a method, to choose between sources of electric lighting such as incandescent single point of light, and a fluorescent area light system. The method of choice of light source based on the electric power cost per room area, at a given light level.

OBJECTS OF THIS INVENTION

An object of this invention is to disclose apparatus for determining light production efficiency on comparison of different light sources, such as incandescent single point light source compared to fluorescent light source, computer monitored for comparison of electric power demand of each of the above light sources at the same light level or intensity for greatest efficiency of lighting, at the work plane, based on electric power demand.

Another object of this invention is to disclose a method for determining light production efficiency on comparison of incandescent single point light source with area fluorescent light source, computer monitored for comparison of electric power demand on controlled on-off switching of each of the above light sources at the same light level or intensity for greatest or highest efficiency of lighting, at the work plane, based on electric power demand.

Prior art U.S. patents pertaining to this present application are;

U.S. Pat. No. 4,701,698 for—ENERGY CONSUMPTION METER.

U.S. Pat. No. 4,933,633 for COMPUTER CONTROLLED ENERGY MONITORING SYSTEM

U.S. Pat. No. 5,315,236 for POWER CONSUMPTION METER.

None of these prior patents would anticipate individually the claims in this application, or on combining the patents would make obvious the matter claimed in the application.

BRIEF DESCRIPTION OF DRAWINGS

| FIG.NO. | DESCRIPTION. |
|---|---|
| 1. | Single point incandescent light first light source. (elevation view) |
| 2. | Single point incandescent light first light source. (plan view) |
| 3. | Area fluorescent light second light source. (elevation view) |
| 4. | Area fluorescent light second light source. (plan view). |
| 5. | Lay out of monitor circuit |
| 6. | Mounting lay out of monitor circuit components on computer panel. |

LEGEND DESCRIPTIONS

| LEGEND | DESCRIPTION |
|---|---|
| 1 | Incandescent light; first light source. |
| 2 | Fluorescent area light; second light source. |
| 3 | Electric meter for incandescent first light source. |
| 4 | Electric meter for fluorescent area second light source. |
| 5 | electric power supply. |
| 6 | Computer. |
| 7 | Incandescent first light meter. |
| 8 | -Fluorescent area light; second light meter. |
| 9 | Incandescent or first light source electric power usage. |
| 10 | Fluorescent area or second light source electric power usage. |
| 11 | Switch from power source to incandescent first light source circuit. |
| 12 | Switch from power source to fluorescent second light circuit. |
| 13 | Main electric meter. |
| 14 | Electric power line to fluorescent area second light source. |
| 15 | Electric power line to incandescent first light source. |
| 16 | Line from electric meter for fluorescent area or second light source to computer. |
| 17 | Line from electric meter for incandescent or first light to computer. |
| 18 | Line from fluorescent area or second light meter to computer. |
| 19 | Line from incandescent or first light meter to computer. |
| 20 | Switch in line from first or incandescent electric meter to computer. |
| 21 | Switch in line from second or fluorescent electric meter to computer. |
| 22 | Switch in line from first light meter to computer. |
| 23 | Switch in line from second light meter to computer. |
| 24 | Electric power line connection to first light source. |
| 24' | Electric power line connection to second light source. |
| 25 | Computer mount panel. |
| d | Distance between light source and respective light meter. |

DETAILED DESCRIPTION OF THE INVENTION

Adequate lighting of a building or work area is costly, in terms of direct dollars, and cost of generating and transmission of electric power, to be more light efficient requires an analysis of the light source.

Figure 1:
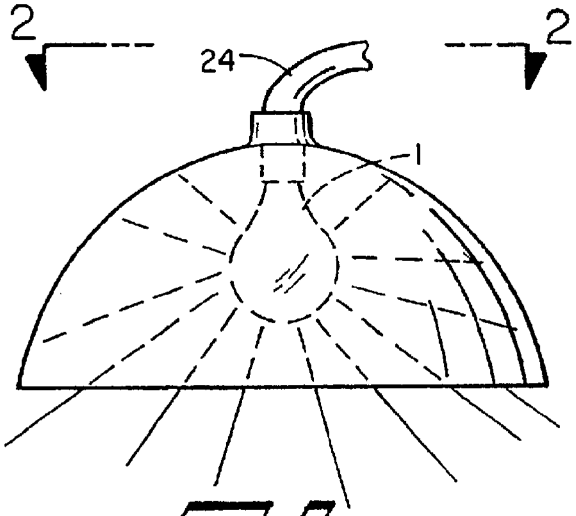
Figure 2:
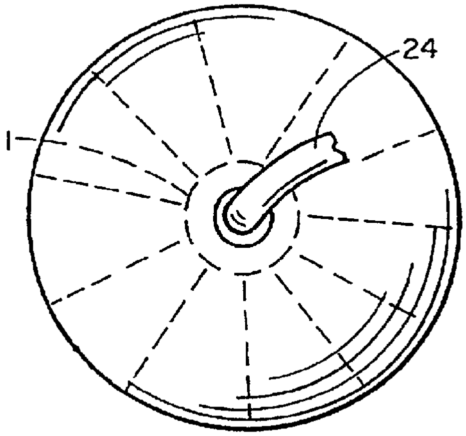
Figure 3:
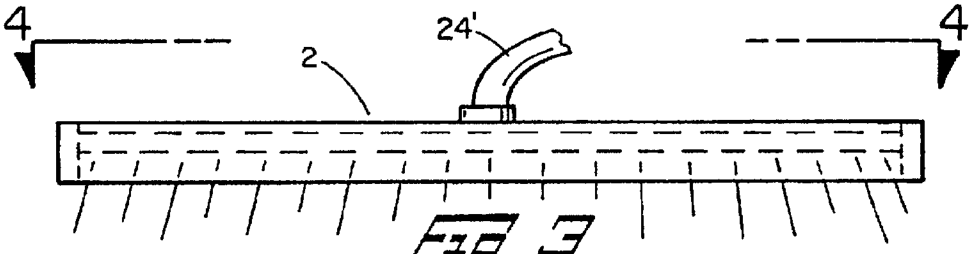
Figure 4:
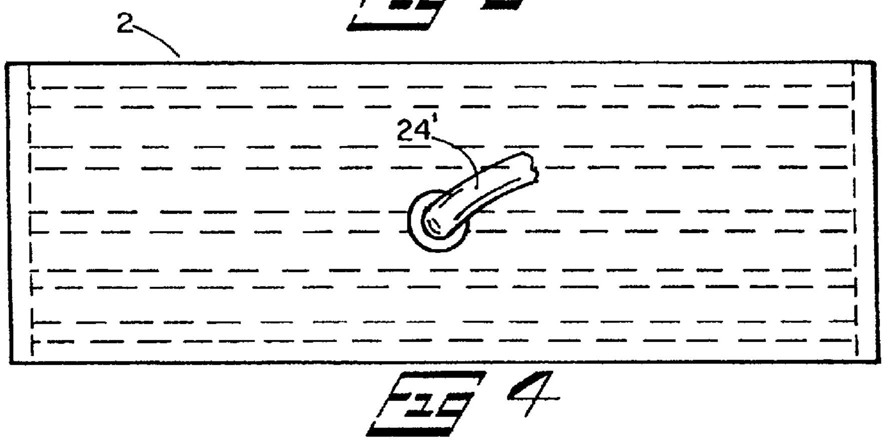
Figure 5:
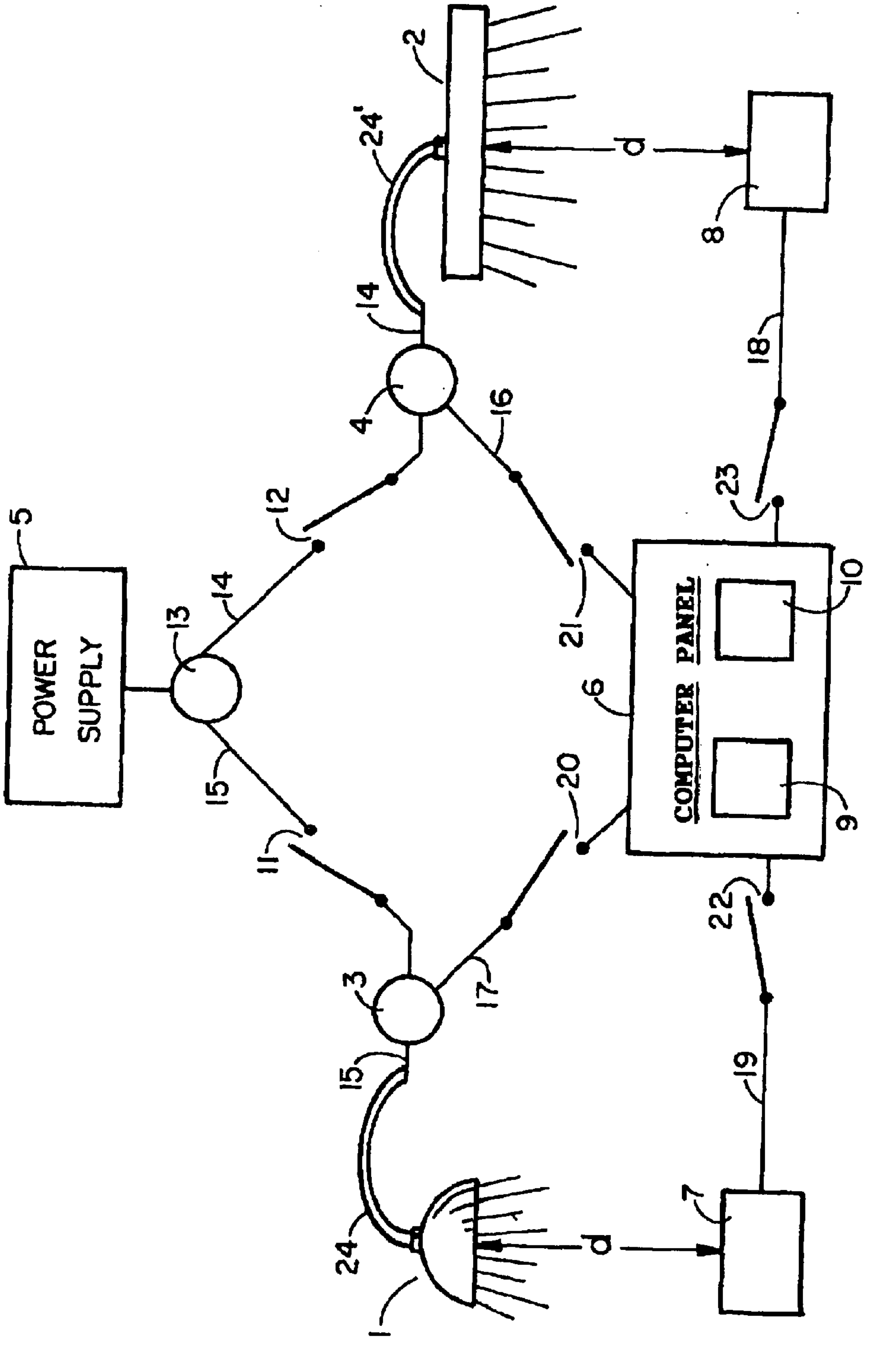

This invention discloses apparatus and lay out of monitor circuit FIG. 5 for determining light production efficiency on comparison of single point incandescent light source 1 (FIG. 1 elevation view, FIG. 2 plan view) with area fluorescent light source 2 (FIG. 3 elevation view, FIG. 4 plan view), a computer 6, power supply 5, main meter 13, a power line 14 from meter 13 to switch 12, to meter 4 for fluorescent area light and line 16 from meter 14 to computer 6, a light meter

8 for fluorescent area light measure connected to computer 6, via line 18, from fluorescent area light meter to computer 6, and fluorescent area light electric power use 10. then indicated in window 10 of computer 6. The electric meter 3 for incandescent light 1 is connected via line 17 to computer 6, and a switch 11 in power source line 15 connected to incandescent light 1 through meter 3. Incandescent light meter 7, connected to computer 6 via line 19, for light meter readings of incandescent light 1. Incandescent light electric power usage 9, to show incandescent light electric power usage or register on the computer 6, and fluorescent light electric power usage 10 shown on computer 6.

In all of the above discussion the terms “connected to” or “line” means an “electric wire connection”.

The above described assembled apparatus then provides a method of measuring the electric power demand for each lighting source at the same lighting level thus the lighting power efficiency is indicated by comparison of the power demand of each source of lighting, and thus on determining and choosing the highest lighting efficiency helps to reduce the power demand and is reflected in being equivalent to a virtual power plant (VPP) because of the power savings.

In regards to the light sources, which are hung on a ceiling, the “incandescent” or incandescent, high intensity (HID) source is included as a single point source, while the “luminescent” light source is mentioned as an area down light source and includes a side by side assembly of straight or long fluorescent tubes, as assembled in a luminaire for downlighting.

The above description of the invention compares an incandescent light source with a fluorescent light source, but is not limited to the light sources shown, but includes apparatus for comparison of any light sources, as follows.

A first light meter 7, and a second light meter 8 and the first light meter 7, at a distance d from the first light source 1, and the second light meter 8, at a distance d from the second light source 2, and an electric meter 3 in the power line source 15 to the first light source, 1, and electric meter 4 in the power line source 14 to the second light source 2. An electric switch 11 in the power line source 15 to the first light source 1, and an electric switch 12 in the power line source 14 to the second light source 2, and the power line source 15 to the first light meter 3 connected to a computer 6, a power line source 14 to the second light electric meter 4 connected to the computer 6, via line 16 and the first light meter 7, connected to the computer 6 via line 19, and a switch 22 in line 19 and the second light mater 8 connected to the computer 6 via line 18, and a switch 23 in line 18, connecting fluorescent area light second light source meter 8 and computer 6. There is a switch 20 in line 17 which line connects electric meter 3 for incandescent first light source to computer 6.

The term “first light source” includes incandescent light source, and the terms may be used interchangeably, also “second light source” may be used interchangeably with fluorescent area light.

Figure 6:
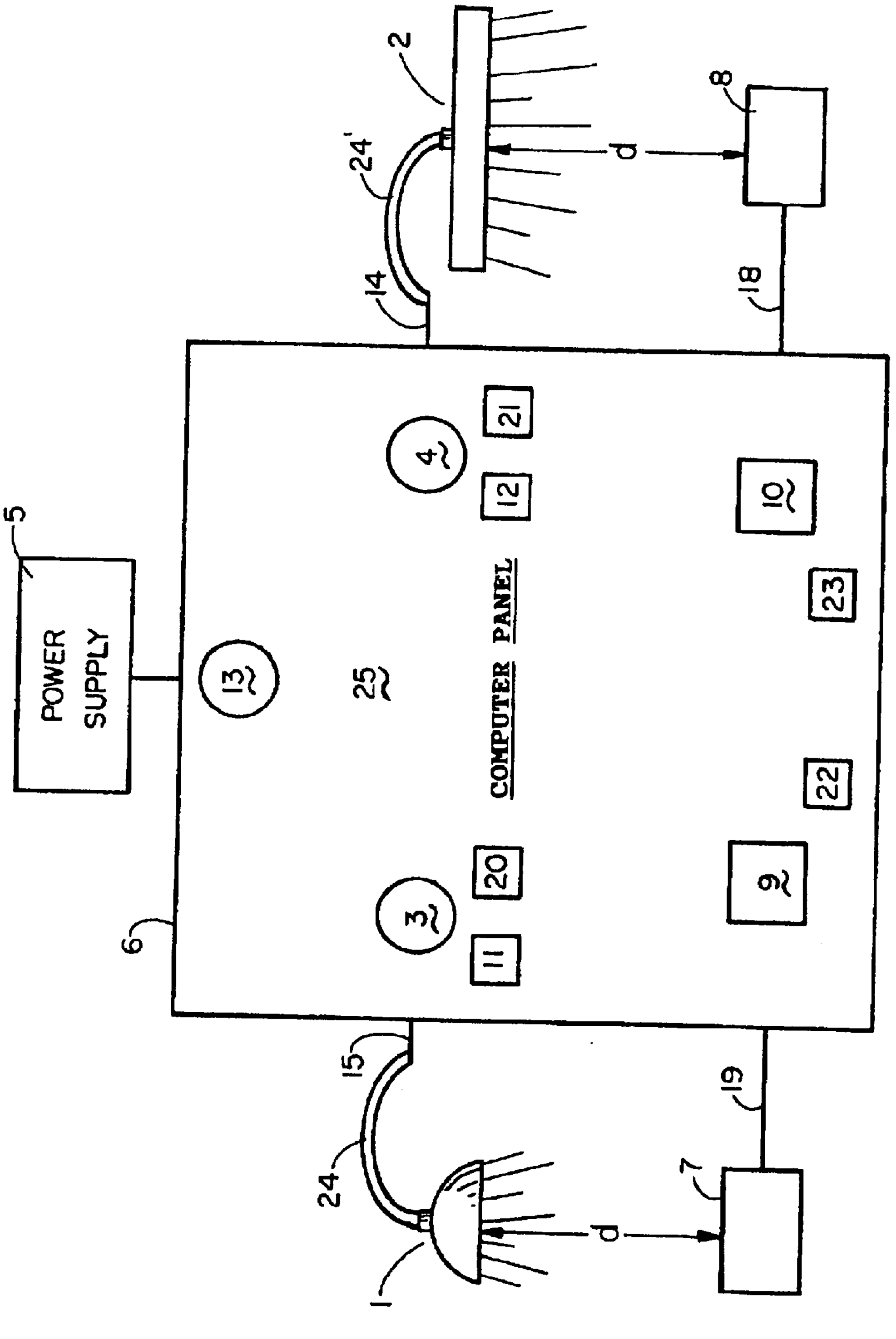

Referring now to FIG. 6, this shows the mounting lay out of the monitor circuit components on the computer mount panel 25.

The apparatus and method disclosed in this invention for determining the most efficient lighting per unit of electric power will aid in reducing the peak power load demand.

“d” distance between second light source and second light meter, may be varied to give adequate or the same light meter reading at the work plane as the first light meter reading.

What is claimed is:

1. Apparatus for comparison of electric power efficiency of light sources comprising:

a—a first light meter, b—a second light meter, c—said first light meter, at a distance d from a first light source, d—said second light meter, at a distance d from a second light source, e—an electric meter in a power line source to said first light source, f—an electric meter in a power line source to said second light source, g—an electric switch in said power line source to said first light source, h—an electric switch in said power line source to said second light source, i—said power line source to said first light meter connected to a computer, j—said power line source to said second light meter connected to said computer, k—said first light meter connected to said computer and l—said second light meter connected to said computer.

2. Apparatus for comparison of electric power efficiency of light sources comprising:

a—an incandescent light meter, b—a fluorescent light meter, c—said incandescent light meter, at a distance d from an incandescent light source, d—said fluorescent light meter, at a distance d from a fluorescent light source, e—an electric meter in a power line source to said incandescent light source, f—an electric meter in a power line source to said fluorescent light source, g—an electric switch in said power line source to said incandescent light source, h—an electric switch in said power line source to said fluorescent light source, i—said power line source to said incandescent light meter connected to a computer, j—said power line source to said fluorescent light meter connected to said computer, k—said incandescent light meter connected to said computer, l—said fluorescent light meter connected to said computer.

3. A method of comparison of incandescent and fluorescent lighting efficiency comprising:

a—an incandescent light meter, b—a fluorescent light meter, c—said incandescent light meter, at a distance d from an incandescent light source, d—said fluorescent light meter, at a distance d from a fluorescent light source, e—an electric meter in a power line source to said incandescent light source, f—an electric meter in a power line source to said fluorescent light source, g—an electric switch in said power line source to said incandescent light source, h—an electric switch in said power line source to said fluorescent light source, i—said power line source to said incandescent light meter connected to a computer, j—said power line source to said fluorescent light meter connected to said computer, k—said incandescent light meter connected to said computer, l—said fluorescent light meter connected to said computer, m—on closing said electric switch in said power line source to said incandescent light source, and opening said electric switch in said power line source to said fluorescent light source, activates said computer to obtain electric watt demand and lumen reading, n—on closing said electric switch in said power line source to said fluorescent light source and opening said electric switch in said power line source to attain the same lumen value as had in the incandescent light source, activates said computer to obtain electric watt demand and, o—efficiency of lighting based on watt demand at a said definite lumen value is obtained by subtracting the low watt demand from the high watt demand at said definite lumen value.

4. A method of comparison of incandescent and fluorescent lighting efficiency of claim 3 further consisting of;

a—an incandescent light meter, b—a fluorescent light meter, c—said incandescent light meter, at a distance d from an incandescent light source, d—said fluorescent light meter, at a distance d from a fluorescent light source, e—an electric meter in a power line source to said incandescent light source, f—an electric meter in a power line source to said fluorescent light source, g—an electric switch in said power line source to said incandescent light source, h—an electric switch in said power line source to said fluorescent light source, i—said power line source to said incandescent light meter connected to a computer, j—said power line source to said fluorescent light meter connected to said computer, k—said incandescent light meter connected to said computer, l—said fluorescent light meter connected to said computer, m—on closing said electric switch in said power line source to said incandescent light source, and opening said electric switch in said power line source to said fluorescent light source, activates said computer to obtain electric watt demand and lumen reading, n—on closing said electric switch in said power line source to said fluorescent light source and opening said electric switch in said power line source to attain the same lumen value as had in the incandescent light source, activates said computer to obtain electric watt demand and, o—closing both of said electric switches at the same time, and to have a same lumen value the watt demand may be shown on said computer for each of said incandescent and fluorescent light sources and, p—the lowest watt reading on said computer indicates efficiency of said light source.

* * * * *